United States Patent
Yuan et al.

(10) Patent No.: US 10,706,332 B2
(45) Date of Patent: Jul. 7, 2020

(54) ANALOG CIRCUIT FAULT MODE CLASSIFICATION METHOD

(71) Applicant: HEFEI UNIVERSITY OF TECHNOLOGY, Anhui (CN)

(72) Inventors: Lifen Yuan, Anhui (CN); Shuai Luo, Anhui (CN); Yigang He, Anhui (CN); Peng Chen, Anhui (CN); Chaolong Zhang, Anhui (CN); Ying Long, Anhui (CN); Zhen Cheng, Anhui (CN); Zhijie Yuan, Anhui (CN); Deqin Zhao, Anhui (CN)

(73) Assignee: HEFEI UNIVERSITY OF TECHNOLOGY, Anhui (CN)

( * ) Notice: Subject to any disclaimer, the term of this patent is extended or adjusted under 35 U.S.C. 154(b) by 268 days.

(21) Appl. No.: 15/555,077

(22) PCT Filed: Nov. 24, 2015

(86) PCT No.: PCT/CN2015/095424
§ 371 (c)(1),
(2) Date: Sep. 1, 2017

(87) PCT Pub. No.: WO2017/024691
PCT Pub. Date: Feb. 16, 2017

(65) Prior Publication Data
US 2018/0039865 A1 Feb. 8, 2018

(30) Foreign Application Priority Data
Aug. 7, 2015 (CN) .......................... 2015 1 0482928

(51) Int. Cl.
G06K 9/62 (2006.01)
G01R 31/316 (2006.01)
(Continued)

(52) U.S. Cl.
CPC ......... G06K 9/6269 (2013.01); G01R 31/316 (2013.01); G06K 9/00523 (2013.01);
(Continued)

(58) Field of Classification Search
CPC .................................................. G06K 9/6269
See application file for complete search history.

(56) References Cited

U.S. PATENT DOCUMENTS 5,754,681 A * 5/1998 Watanabe ............ G06K 9/6215
382/159
6,662,170 B1 12/2003 Dom et al.
(Continued)

FOREIGN PATENT DOCUMENTS

| CN | 101533068 | 9/2009 |
|---|---|---|
| CN | 103245907 | 8/2013 |

(Continued)

OTHER PUBLICATIONS

"International Search Report (Form PCT/ISA/210) of PCT/CN2015/095424", dated Apr. 28, 2016, with English translation thereof, pp. 1-4.

Primary Examiner — Raymond L Nimox
(74) Attorney, Agent, or Firm — JCIPRNET

(57) ABSTRACT

An analog circuit fault mode classification method comprises the following implementation steps: (1) collecting M groups of voltage signal sample vectors $V_{ij}$ to each of fault modes $F_i$ of the analog circuit by using a data collection board; (2) sequentially extracting fault characteristic vectors $V_{ij}^F$ of the voltage signal sample vectors $V_{ij}$ by using subspace projection; (3) standardizing the extracted fault characteristic vectors $V_{ij}^F$ to obtain standardized fault characteristic vectors; (4) constructing a fault mode classifier based on a support vector machine, inputting the standardized fault characteristic vectors, performing learning and training on the classifier, and determining structure param- (Continued)

eters of the classifier; and (5) completing determination of fault modes according to fault mode determination rules. The fault mode classifier of the present invention is simple in learning and training and reliable in mode classification accuracy.

4 Claims, 2 Drawing Sheets

(51) Int. Cl.
  *G06K 9/00* (2006.01)
  *G06K 9/03* (2006.01)
(52) U.S. Cl.
  CPC ........... *G06K 9/00536* (2013.01); *G06K 9/03* (2013.01); *G06K 9/6247* (2013.01); *G06K 9/6256* (2013.01); *G06K 9/6284* (2013.01)

(56) References Cited

U.S. PATENT DOCUMENTS

| | | | | |
|---|---|---|---|---|
| 7,318,051 | B2* | 1/2008 | Weston | G06K 9/6215 706/12 |
| 7,353,215 | B2* | 4/2008 | Bartlett | G06K 9/6215 706/46 |
| 2013/0132001 | A1* | 5/2013 | Yacout | G01D 3/10 702/35 |
| 2016/0242690 | A1* | 8/2016 | Principe | A61B 5/742 |

FOREIGN PATENT DOCUMENTS

| | | |
|---|---|---|
| CN | 104198924 | 12/2014 |
| CN | 105046279 | 11/2015 |

\* cited by examiner

ANALOG CIRCUIT FAULT MODE CLASSIFICATION METHOD

CROSS-REFERENCE TO RELATED APPLICATION

This application is a 371 application of the International PCT application serial no. PCT/CN2015/095424, filed on Nov. 24, 2015, which claims the priority benefit of China application no. 201510482928.2, filed on Aug. 07, 2015. The entirety of each of the above-mentioned patent applications is hereby incorporated by reference herein and made a part of this specification.

TECHNICAL FIELD

The present invention relates of the field of analog circuit fault diagnosis, and more particularly, to an analog circuit fault mode classification method.

BACKGROUND

The rapid development of modern electronic and computer technologies drives more and more complicated composition and structure of electronic equipment as well as increasingly large scale thereof. To improve system safety and reliability, higher and newer requirements are raised on circuit test and diagnosis. Analog circuits in an electronic system are prone to get wrong, and analog circuit fault diagnosis has also been a "bottleneck" that restricts the circuit industry of China. It is of great theoretical values and practical significance to develop the analog circuit industry in order to conform to the new development of modern microelectronics technologies and information technologies.

At present, an analog circuit fault model classifier based on a support vector machine has the advantages that it is suitable for small sample decision, has lower requirements on the number of learning samples and can mine the classification information hidden in data under the circumstance of limited characteristic information. But its defects are that the dimensionality of the fault characteristic vectors is too large, which will increase the difficulty of learning and training of the support vector machine. In addition, different processing methods on the training data will also affect the classification accuracy of the fault mode classifier.

SUMMARY

A technical problem to be solved by the present invention is to provide an analog circuit fault mode classification method to overcome the above defects of the prior art, so as to facilitate lightening the learning and training difficulties of the fault mode classifier and improving the classification accuracy of the fault mode classifier.

According to the present invention, a fault mode classifier is constructed on the basis of a support vector machine, and fault characteristics are extracted by using a subspace projection method, then the fault characteristics are standardized, and finally the standardized fault characteristics are utilized to train the support vector machine, so that the analog circuit fault mode classifier is constructed.

A technical solution to be adopted by the present invention to solve the technical problems thereof is as follows:

An analog circuit fault mode classification method comprises the following steps:

An analog circuit fault mode classification method is characterized by comprising the following steps:

(1) collecting M groups of voltage signal sample vectors $V_{ij}$ at a node to be tested under each of fault modes $F_i$ of the analog circuit by using a data collection board, wherein i=1, 2, ..., N, j=1, 2, ..., M $V_{ij}$ represents a $j^{th}$ voltage signal sample vector of a $i^{th}$ fault mode, and N represents a total number of the fault modes;

(2) sequentially extracting fault characteristic vectors $V_{ij}^F$ of the voltage signal sample vectors $V_{ij}$ working under the fault modes $F_i$ by using subspace projection, wherein i=1, 2, ..., N, j=1, 2, ..., M, and $V_{ij}^F$ represents a fault characteristic vector of the $j^{th}$ voltage signal sample under the $i^{th}$ fault mode;

(3) standardizing the extracted fault characteristic vectors $V_{ij}^F$ to obtain standardized fault characteristic vectors $\hat{V}_{ij}^F$, wherein a computing method thereof is $$\hat{V}_{ij}^F = \frac{V_{ij}^F}{\|V_{ij}^F\|};$$

(4) sequentially constructing a binary-class support vector machine with respect to two different fault modes $F_{i_1}$ and $F_{i_2}$, wherein $i_1=1, 2, \ldots, N$, $i_2=1, 2, \ldots, N$, $(i_1 \neq i_2)$, N is the total number of the fault modes, then $N(N-1)/2$ different binary-class support vector machines can be constructed in total; and (5) simultaneously feeding a standardized fault characteristic vectors to be tested into the $N(N-1)/2$ binary-class support vector machines for classification and determination, and counting votes according to classification results of each binary-class support vector machine; if a fault mode to be tested belongs to the fault mode $F_i$, and i=1, 2, ..., N, then adding 1 to the votes of $F_i$, wherein a fault mode obtaining the most votes finally is the fault mode that the circuit to be tested belongs to.

Further, the step of extracting the fault characteristic vectors $V_{ij}^F$ by using the subspace projection in step (2) is:

(2.1) computing dimensionality of the voltage signal sample vectors $V_{ij}$: L=length($v_{ij}$);

(2.2) generating an L×L dimensional Toeplitz transformation matrix $\Phi$:

$$\Phi = \begin{bmatrix} F_{11} & F_{12} & \ldots & F_{1L} \\ F_{12} & F_{13} & \ldots & F_{11} \\ \ldots & \ldots & \ldots & \ldots \\ F_{1L} & F_{11} & \ldots & F_{1(L-1)} \end{bmatrix},$$

wherein $$F_{1k} = e^{-j\frac{2\pi}{L}k},$$

$$k = 1, 2, \ldots, L;$$

(2.3) computing a projected vector of the voltage signal sample vectors $V_{ij}$ in the Toeplitz transformation matrix $\Phi$: $V_p = \Phi^T V_{ij}$, wherein T represents to transpose a matrix;

(2.4) computing maximum projection subspace and the fault characteristic vectors $V_{ij}^F$:

(2.4.1) initializing a subspace projection coordinate dimensionality K: K=⌈log$_2$(N)⌉, wherein ⌈·⌉ represents rounding up to an integer, and N is the total number of the fault modes of the circuit to be tested;

(2.4.2) constructing a maximum projection subspace index vector I with a dimensionality of 1×K, and initializing the vector into a 1×K dimensional null vector, i.e., I=[00 . . . 0], and meanwhile constructing a counting variable p and initializing p=1;

(2.4.3) updating the maximum projection subspace index vector I: I(p)=Index(Max(|V$_p$|)), wherein I(p) herein represents the $p^{th}$ vector value in the vector I, Max(•) represents to compute a maximum vector element, V$_p$ represents the projected vector of the voltage signal sample vectors V$_{ij}$ in the Toeplitz transformation matrix Φ, and Index(•) represents to calculate an index;

(2.4.4) determining whether p<K; if no, then performing step (2.4.5); otherwise, performing p=p+1 and using 0 to replace the maximum element in the projected vector V$_P$, and retuning to step (2.4.3);

(2.4.5) using I vector elements as row index values of the Toeplitz transformation matrix Φ to extract corresponding row vectors to constitute a matrix Φ$_A$ with a dimensionality of K×L;

(2.4.6) computing the maximum projection subspace Φ$_A^†$: Φ$_A^†$=(Φ$_A$Φ$_A^T$)$^{-1}$Φ$_A$; and (2.4.7) computing the fault characteristic vector V$_{ij}^F$ with subspace projection: V$_{ij}^F$=Φ$_A^†$V$_{ij}$.

Further, the specific step of constructing each binary-class support vector machine in step (4) is:

(4.1) constructing a binary classifier decision model $$f(x) = \sum_{i}^{N} \alpha_i y_i \exp(-\|x-x_i\|^2/2) + b,$$

wherein $\overline{N}$ represents the number of training data samples, x$_i$ is called as a support vector, α$_i$ is a certain real number, b is a bias, and y$_i$∈y={+1, −1} is a class identifier;

(4.2) dividing a training sample set: constituting the standardized fault characteristic vectors $\hat{V}_{i_1j}^F$ and $\hat{V}_{i_2j}^F$ under the fault modes F$_{i_1}$ and F$_{i_2}$ into a training sample set S={{S$_+$}, {S$_-$}}, wherein j=1, 2, . . . , M, S$_+$={($\hat{V}_{i_11}^F$, +1), ($\hat{V}_{i_12}^F$, +1), . . . , ($\hat{V}_{i_1M}^F$, +1)}, S$_-$={($\hat{V}_{i_21}^F$, −1), ($\hat{V}_{i_22}^F$, −1), . . . , ($\hat{V}_{i_2M}^F$, −1)}, a class identifier of F$_{i_1}$ is defined as +1, and a class identifier of F$_{i_2}$ is defined as −1;

(4.3) using the training sample set S to train the binary classifier decision model so as to determine parameters α$_i$ and b of the binary-class support vector machine;

(4.4) outputting a determination function of the binary-class support vector machine:

$$y = \text{sgn}\left(\sum_{i}^{N} \alpha_i y_i \exp(-\|x-x_i\|^2/2) + b\right),$$

wherein sgn (•) is a sign function, and $\overline{N}$ represents the number of the training data samples; and (4.5) completing a mode determination for a characteristic to be tested according to the decision function: determination votes during test process are performed according to the determination function; if y=1 is outputted, then the votes of the fault mode F$_{i_1}$ plus 1; otherwise, the votes of the fault mode F$_{i_2}$ plus 1.

Further, the specific step of using the training sample set S to train the binary classifier decision model so as to determine the parameters α$_i$ and b of the binary-class support vector machine in step (4.3) is:

(4.3.1) standardizing a kernel matrix:

$$\overline{K} = \begin{bmatrix} \overline{K}_{11} & \overline{K}_{12} & \ldots & \overline{K}_{1,2M} \\ \overline{K}_{21} & \overline{K}_{22} & \ldots & \overline{K}_{2,2M} \\ \vdots & \vdots & \vdots & \vdots \\ \overline{K}_{2M,1} & \overline{K}_{2M,2} & \ldots & \overline{K}_{2M,2M} \end{bmatrix},$$

wherein $\overline{K}_{ij}$=exp(−∥x$_i$−x$_j$∥$^2$/2), i, j=1, 2, . . . , 2M, M represents the number of the voltage signal sample vectors collected;

D=diag(1/sqrt(diag($\overline{K}$))), wherein diag(•) represents to compute a diagonal matrix, and sqrt(•) represents to compute a root-mean-square of matrix elements; $\overline{K}$ is updated: $\overline{K}$←D*$\overline{K}$*D; and $\overline{K}$ represents to the standardized kernel matrix;

(4.3.2) training a binary classifier, which a training pseudo-code is as follows:

inputting the training sample set S={{S$_+$}, {S$_-$}};
treating process: if a class identifier y$_i$=+1, then $$\alpha_i^+ = \frac{1}{M};$$

otherwise, α$_i^+$=0;
if a class identifier y$_i$=−1, then $$\alpha_i^- = \frac{1}{M};$$

otherwise, α$_i^-$=0; M represents the number of the voltage signal sample vectors collected;

α$^+$=[α$_1^+$, α$_2^+$, . . . , α$_{2M}^+$], α$^-$=[α$_1^-$, α$_2^-$, . . . , α$_{2M}^-$]; and (4.3.3) computing classifier parameters:
wherein the real number α$_i$=α$_i^+$−α$_i^-$; and
the bias b=0.5((α$^+$)$^T\overline{K}$α$^+$−(α$^-$)$^T\overline{K}$α$^-$), wherein (•)$^T$ represents transpose of matrix or vector; and $\overline{K}$ represents to the standardize kernel matrix.

Compared with the prior art, the present invention has the following advantages.

(1) The present invention extracts the fault characteristic vectors by using a subspace projection method in the present invention, and determines a proper dimensionality of the fault characteristic vectors according to the length of the voltage signal sample vectors, ensures the integrality of the fault characteristic information and also reduces redundant fault characteristics, and is beneficial for decreasing the learning and training difficulties of the fault mode classifier.

(2) The present invention uses a standardizing processing method to process the fault characteristic vectors, which has more apparent effects on improving the classification accuracy of the fault mode classifier.

DETAILED DESCRIPTION

The invention will be described in details hereinafter with reference to the drawings and embodiments.

Figure 1:
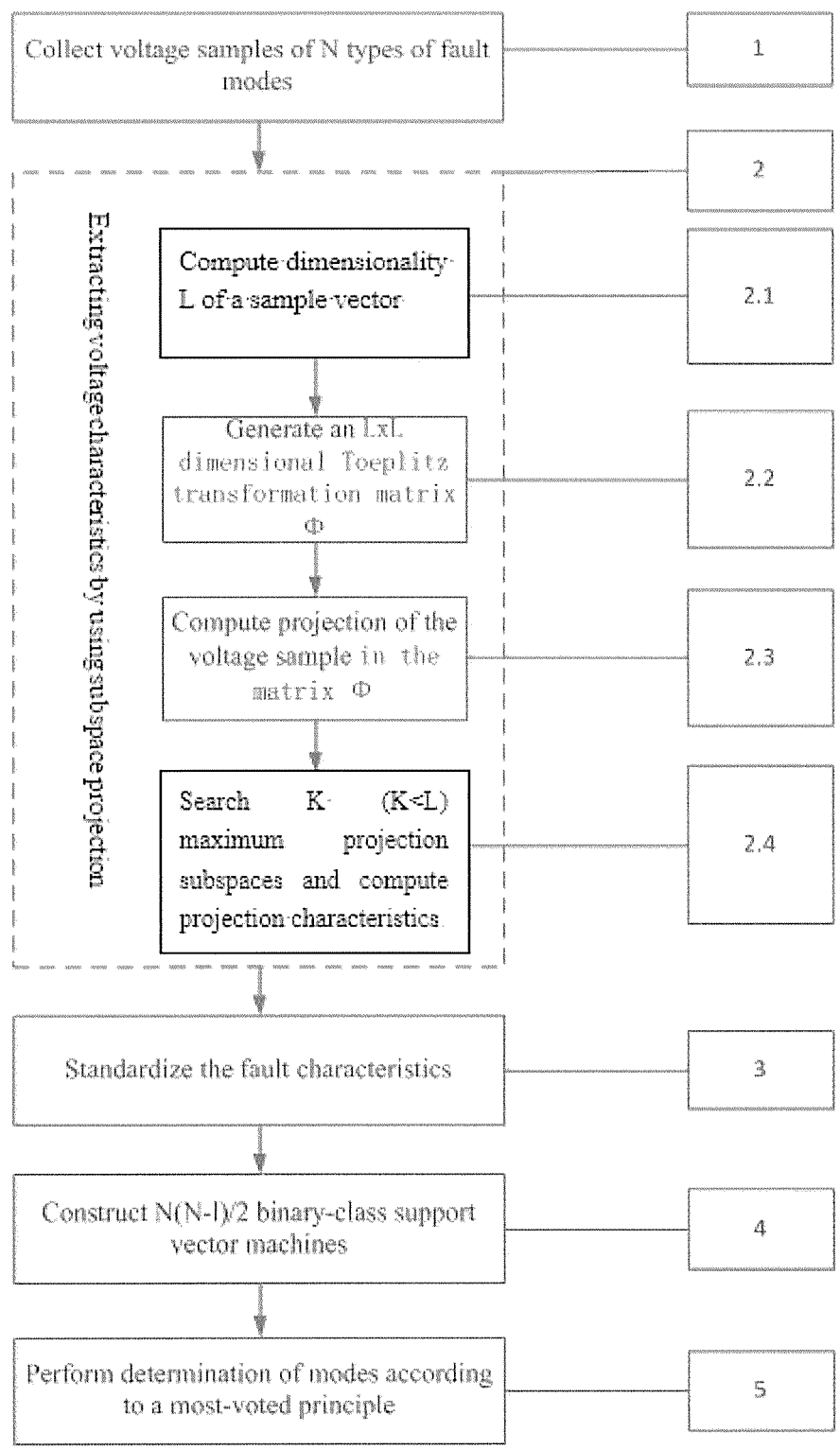
FIG. 1 is a block diagram illustrating a flow of an analog circuit fault mode classification method according to the invention.

Referring to FIG. 1, an analog circuit fault mode classification method comprises the following steps:

(1) collecting M groups of voltage signal sample vectors $V_{ij}$ at a node to be tested under each of the fault modes $F_i$ of the analog circuit by using a data collection board, wherein i=1, 2, . . . , N, j=1, 2, . . . , M, $V_{ij}$ represents a $j^{th}$ voltage signal sample vector of a $i^{th}$ fault mode, and N represents a total number of the fault modes;

(2) sequentially extracting fault characteristic vectors $V_{ij}^F$ of the voltage signal sample vectors $V_{ij}$ working under the fault modes $F_i$ by using subspace projection, wherein i=1, 2, . . . , N, j=1, 2, . . . , M, and $V_{ij}^F$ represents a fault characteristic vector of the $j^{th}$ voltage signal sample under the $i^{th}$ fault mode;

(3) standardizing the extracted fault characteristic vectors $V_{ij}^F$ to obtain standardized fault characteristic vectors $\hat{V}_{ij}^F$, wherein a computing method thereof is $$\hat{V}_{ij}^F = \frac{V_{ij}^F}{\|V_{ij}^F\|};$$

(4) sequentially constructing a binary-class support vector machine with respect to two different fault modes $F_{i_1}$ and $F_{i_2}$, wherein $i_1$=1, 2, . . . , N, $i_2$=1, 2, . . . , N, ($i_1 \neq i_2$), N is the total number of the fault modes, then N(N−1)/2 different binary-class support vector machines can be constructed in total; and (5) simultaneously feeding a standardized fault characteristic vectors to be tested into the N(N−1)/2 binary-class support vector machines for classification and determination, and counting votes according to classification results of each binary-class support vector machine; if a fault mode to be tested belongs to the fault mode $F_i$, and i=1, 2, . . . , N, then adding 1 to the votes of $F_i$ wherein a fault mode obtaining the most votes finally is the fault mode that the circuit to be tested belongs to.

The step of extracting the fault characteristic vectors $V_{ij}^F$ by using the subspace projection in step (2) is:

(2.1) computing dimensionality of the voltage signal sample vectors $V_{ij}$: L=length($V_{ij}$);

(2.2) generating an L×L dimensional Toeplitz transformation matrix Φ:

$$\Phi = \begin{bmatrix} F_{11} & F_{12} & \ldots & F_{1L} \\ F_{12} & F_{13} & \ldots & F_{11} \\ \ldots & \ldots & \ldots & \ldots \\ F_{1L} & F_{11} & \ldots & F_{1(L-1)} \end{bmatrix}, \text{ wherein}$$

$$F_{1k} = e^{-j\frac{2\pi}{L}k}, k = 1, 2, \ldots, L;$$

(2.3) computing a projected vector of the voltage signal sample vectors $V_{ij}$ in the Toeplitz transformation matrix Φ: $V_p = \Phi^T V_{ij}$, wherein T represents to transpose a matrix;

(2.4) computing maximum projection subspace and the fault characteristic vectors $V_{ij}^F$:

(2.4.1) initializing a subspace projection coordinate dimensionality K: K=⌈$\log_2(N)$⌉, wherein ⌈•⌉ represents rounding up to an integer, and N is the total number of the fault modes of the circuit to be tested;

(2.4.2) constructing a maximum projection subspace index vector I with a dimensionality of 1×K, and initializing the vector into a 1×K dimensional null vector, i.e., I= [00 . . . 0], and meanwhile constructing a counting variable p and initializing p=1;

(2.4.3) updating the maximum projection subspace index vector I: I(p)=Index(Max(|$V_p$|)), wherein I(p) herein represents the $p^{th}$ vector value in the vector I, Max(•) represents to compute a maximum vector element, $V_p$ represents the projected vector of the voltage signal sample vectors $V_{ij}$ in the Toeplitz transformation matrix Φ, and Index(•) represents to calculate an index;

(2.4.4) determining whether p<K; if no, then performing step (2.4.5); otherwise, performing p=p+1 and using 0 to replace the maximum element in the projected vector $V_p$, and retuning to step (2.4.3);

(2.4.5) using I vector elements as row index values of the Toeplitz transformation matrix Φ to extract corresponding row vectors to constitute a matrix $\Phi_A$ with a dimensionality of K×L;

(2.4.6) computing the maximum projection subspace $\Phi_A^\dagger$: $\Phi_A^\dagger = (\Phi_A \Phi_A^T)^{-1} \Phi_A$; and (2.4.7) computing the fault characteristic vector $V_{ij}^F$ with subspace projection: $V_{ij}^F = \Phi_A^\dagger V_{ij}$.

Figure 2:
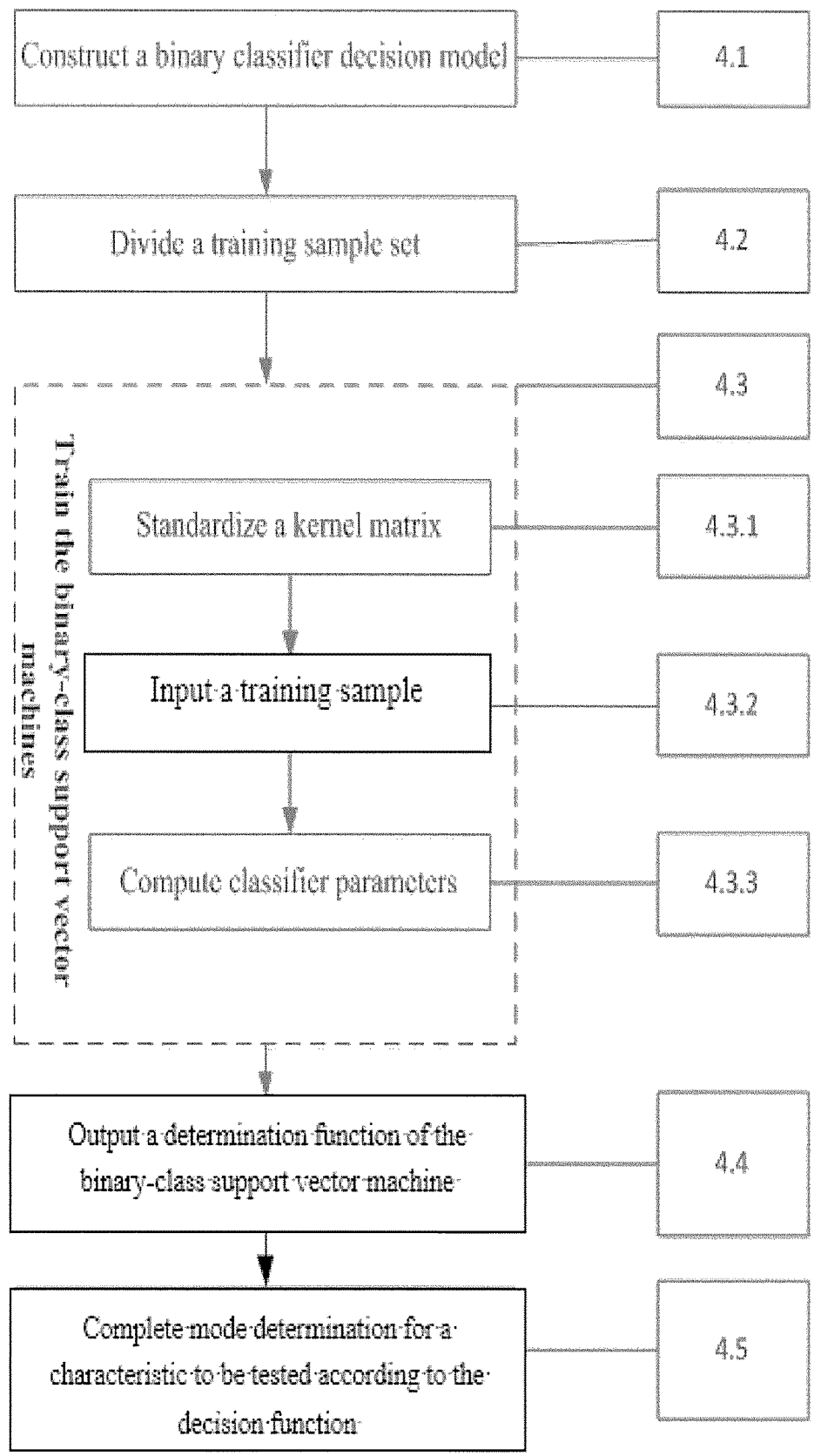
FIG. 2 is a block diagram illustrating steps of constructing a binary-class support vector machine according to the invention.

Referring to FIG. 2, the specific step of constructing each binary-class support vector machine in step (4) is:

(4.1) constructing a binary classifier decision model $$f(x) = \sum_i^{\overline{N}} \alpha_i y_i \exp(-\|x - x_i\|^2/2) + b,$$

wherein $\overline{N}$ represents the number of training data samples, $x_i$ is called as a support vector, $\alpha_i$ is a certain real number, b is a bias, and $y_i \in y = \{+1, -1\}$ is a class identifier;

(4.2) dividing a training sample set: constituting the standardized fault characteristic vectors $\hat{V}_{i_1 j}^F$ and $\hat{V}_{i_2 j}^F$ under the fault modes $F_{i_1}$ and $F_{i_2}$ into a training sample set S={{$S_+$}, {$S_-$}}, wherein j=1, 2, . . . , M, $S_+$={($\hat{V}_{i_1 1}^F$, +1), ($\hat{V}_{i_1 2}^F$, +1), . . . , ($\hat{V}_{i_1 M}^F$, +1)}, $S_-$={($\hat{V}_{i_2 1}^F$, −1), ($\hat{V}_{i_2 2}^F$, −1), . . . , ($\hat{V}_{i_2 M}^F$, −1)}, a class identifier of $F_{i_1}$ is defined as +1, and a class identifier of $F_{i_2}$ is defined as −1;

(4.3) using the training sample set S to train the binary classifier decision model so as to determine parameters $\alpha_i$ and b of the binary-class support vector machine;

(4.4) outputting a determination function of the binary-class support vector machine:

$$y = \text{sgn}\left(\sum_i^{\overline{N}} \alpha_i y_i \exp(-\|x - x_i\|^2/2) + b\right),$$

wherein sgn(•) is a sign function, and $\overline{N}$ represents the number of the training data samples; and (4.5) completing a mode determination for a characteristic to be tested according to the decision function: determination votes during test are performed according to the determination function; if y=1 is outputted, then the votes of the fault mode $F_{i_1}$ plus 1; otherwise, the votes of the fault mode $f_{i_2}$ plus 1.

The specific step of using the training sample set S to train the binary classifier decision model so as to determine the parameters $\alpha_i$ and b of the binary-class support vector machine in step (4.3) is:

(4.3.1) standardizing a kernel matrix:

$$\overline{K} = \begin{bmatrix} \overline{K}_{11} & \overline{K}_{12} & \ldots & \overline{K}_{1,2M} \\ \overline{K}_{21} & \overline{K}_{22} & \ldots & \overline{K}_{2,2M} \\ \vdots & \vdots & \vdots & \vdots \\ \overline{K}_{2M,1} & \overline{K}_{2M,2} & \ldots & \overline{K}_{2M,2M} \end{bmatrix},$$

wherein $\overline{K}_{ij} = \exp(-\|x_i - x_j\|^2/2)$, $i, j = 1, 2, \ldots, 2M$, M represents the number of the voltage signal sample vectors collected;

$D = \text{diag}(1/\text{sqrt}(\text{diag}(\overline{K})))$, wherein diag(•) represents to compute a diagonal matrix, and sqrt(•) represents to compute a root-mean-square of matrix elements; $\overline{K}$ is updated: $\overline{K} \leftarrow D*\overline{K}*D$; and $\overline{K}$ represents to the standardized kernel matrix;

(4.3.2) training a binary classifier, which a training pseudo-code thereof is as follows:
inputting the training sample set $S = \{\{S_+\}, \{S_-\}\}$;
treating process: if a class identifier $y_i = +1$, then $$\alpha_i^+ = \frac{1}{M};$$

otherwise, $\alpha_i^+ = 0$;
if a class identifier $y_i = -1$, then $$\alpha_i^- = \frac{1}{M};$$

otherwise, $\alpha_i^- = 0$; M represents the number of the voltage signal sample vectors collected;
$\alpha^+ = [\alpha_1^+, \alpha_2^+, \ldots, \alpha_{2M}^+]$, $\alpha^- = [\alpha_1^-, \alpha_2^-, \ldots, \alpha_{2M}^-]$; and
(4.3.3) computing classifier parameters:
wherein the real number $\alpha_i = \alpha_i^+ - \alpha_i^-$; and
the bias $b = 0.5((\alpha^+)^T \overline{K} \alpha^+ - (\alpha^-)^T \overline{K} \alpha^-)$, wherein $(\bullet)^T$ represents transpose of matrix or vector; and $\overline{K}$ represents to the standardize kernel matrix.

What is claimed is:

1. An analog circuit fault mode classification method, comprising:
(1) collecting M groups of voltage signal sample vectors $V_{ij}$ at a node to be tested under each of fault modes $F_i$ of the analog circuit by using a data collection board, wherein $j = 1, 2, \ldots, M$, $i = 1, 2, \ldots, N$, $V_{ij}$ represents a $j^{th}$ voltage signal sample vector of a $i^{th}$ fault mode, and N represents a total number of the fault modes;
(2) sequentially extracting fault characteristic vectors $V_{ij}^F$ of the voltage signal sample vectors $V_{ij}$ working under the fault modes $F_i$ by using subspace projection, wherein $i = 1, 2, \ldots, N$, $j = 1, 2, \ldots, M$, and $V_{ij}^F$ represents a fault characteristic vector of the $j^{th}$ voltage signal sample under the $i^{th}$ fault mode;
(3) standardizing the extracted fault characteristic vectors $V_{ij}^F$ to obtain standardized fault characteristic vectors $\hat{V}_{ij}^F$, wherein a computing method for obtaining the standardized fault characteristic vectors is $$\hat{V}_{ij}^F = \frac{V_{ij}^F}{\|V_{ij}^F\|};$$

(4) sequentially constructing a binary-class support vector machine with respect to two different fault modes $F_{i_1}$ and $F_{i_2}$, wherein $i_1 = 1, 2, \ldots, N$, $i_2 = 1, 2, \ldots, N$, and $i_1 \neq i_2$, N is the total number of the fault modes, then $N(N-1)/2$ different binary-class support vector machines can be constructed in total; and
(5) classifying a standardized fault characteristic vectors to be tested to obtain a classification result by simultaneously feeding a standardized fault characteristic to be tested into the $N(N-1)/2$ binary-class support vector machines in response to the fault mode to be tested is classified to the fault mode $F_i$ by the binary-class support vector machine and $i = 1, 2, \ldots, N$, adding 1 to the votes of the fault mode $F_i$, and, determining the fault modes having most votes is a circuit to be tested belongs to.

2. The analog circuit fault mode classification method according to claim 1, wherein the step of extracting the fault characteristic vectors $V_{ij}^F$ by using the subspace projection in step (2) comprises:
(2.1) computing dimensionality L of the voltage signal sample vectors $V_{ij}$: $L = \text{length}(V_{ij})$;
(2.2) generating an L×L dimensional Toeplitz transformation matrix $\Phi$:

$$\Phi = \begin{bmatrix} F_{11} & F_{12} & \ldots & F_{1L} \\ F_{12} & F_{13} & \ldots & F_{11} \\ \ldots & \ldots & \ldots & \ldots \\ F_{1L} & F_{11} & \ldots & F_{1(L-1)} \end{bmatrix}, \text{wherein}$$

$F_{1k} = e^{-j\frac{2\pi}{L}k}$, $k = 1, 2, \ldots, L$;

(2.3) computing a projected vector of the voltage signal sample vectors $V_{ij}$ in the Toeplitz transformation matrix $\Phi$: $V_p = \Phi^T V_{ij}$, wherein T represents to transpose a matrix;
(2.4) computing maximum projection subspace and the fault characteristic vectors $V_{ij}^F$:
(2.4.1) initializing a subspace projection coordinate dimensionality K: $K = \lceil \log_2(N) \rceil$, wherein $\lceil \bullet \rceil$ represents rounding up to an integer, and N is the total number of the fault modes of the circuit to be tested;
(2.4.2) constructing a maximum projection subspace index vector I with a dimensionality of 1×K, and initializing the maximum projection subspace index vector into a 1×K dimensional null vector, i.e., I = [0 0 . . . 0], and meanwhile constructing a counting variable p and initializing p = 1;
(2.4.3) updating the maximum projection subspace index vector I: $I(p) = \text{Index}(\text{Max}(|V_p|))$, wherein I(p) herein represents the $p^{th}$ vector value in the vector I, Max(•) represents to compute a maximum vector element, $V_p$ represents the projected vector of the voltage signal sample vectors $V_{ij}$ in the Toeplitz transformation matrix $\Phi$, and Index(•) represents to calculate an index;
(2.4.4) determining whether p<K; if no, then performing step (2.4.5); otherwise, performing p = p+1 and using 0 to replace the maximum element in the projected vector $V_p$, and retuning to step (2.4.3);
(2.4.5) using I vector elements as row index values of the Toeplitz transformation matrix $\Phi$ to extract corresponding row vectors to constitute a matrix $\Phi_\Lambda$ with a dimensionality of K×L;
(2.4.6) computing the maximum projection subspace $\Phi_\Lambda^\dagger$: $\Phi_\Lambda^\dagger = (\Phi_\Lambda \Phi_\Lambda^T)^{-1} \Phi_\Lambda$; and
(2.4.7) computing the fault characteristic vector $V_{ij}^F$ with subspace projection: $V_{ij}^F = \Phi_\Lambda^\dagger V_{ij}$.

3. The analog circuit fault mode classification method according to claim 1, wherein the specific step of constructing each binary-class support vector machine in step (4) comprises:

(4.1) constructing a binary classifier decision model $$f(x) = \sum_{i}^{\bar{N}} \alpha_i y_i \exp(-\|x - x_i\|^2/2) + b,$$

wherein $\bar{N}$ represents the number of training data samples, $x_i$ is called as a support vector, $\alpha_i$ is a certain real number, b is a bias, and $y_i \in y = \{+1, -1\}$ is a class identifier;

(4.2) dividing a training sample set: constituting the standardized fault characteristic vectors $\hat{V}_{i_1 j}^F$ and $\hat{V}_{i_2 j}^F$ under the fault modes $F_{i_1}$ and $F_{i_2}$ into a training sample set $S = \{\{S_+\}, \{S_-\}\}$, wherein $j=1, 2, \ldots, M$, $S_+ = \{(\hat{V}_{i_1 1}^F, +1), (\hat{V}_{i_1 2}^F, +1), \ldots, (\hat{V}_{i_1 M}^F, +1)\}$, $S_- = \{(\hat{V}_{i_2 1}^F, -1), (\hat{V}_{i_2 2}^F, -1), \ldots, (\hat{V}_{i_2 M}^F, -1)\}$, a class identifier of $F_{i_1}$ is defined as +1, and a class identifier of $F_{i_2}$ is defined as -1;

(4.3) using the training sample set S to train the binary classifier decision model so as to determine parameters $\alpha_i$ and b of the binary-class support vector machine;

(4.4) outputting a determination function of the binary-class support vector machine:

$$y = \text{sgn}\left(\sum_{i}^{\bar{N}} \alpha_i y_i \exp(-\|x - x_i\|^2/2) + b\right),$$

wherein sgn(•) is a sign function, and $\bar{N}$ represents the number of the training data samples; and (4.5) completing a mode determination for a characteristic to be tested according to the determination function: determination votes during test process are performed according to the determination function; if y=1 is outputted, then the votes of the fault mode $F_{i_1}$ plus 1; otherwise, the votes of the fault mode $F_{i_2}$ plus 1.

4. The analog circuit fault mode classification method according to claim 3, wherein the specific step of using the training sample set S to train the binary classifier decision model so as to determine the parameters $\alpha_i$ and b of the binary-class support vector machine in step (4.3) comprises:

(4.3.1) standardizing a kernel matrix:

$$\bar{K} = \begin{bmatrix} \bar{K}_{11} & \bar{K}_{12} & \ldots & \bar{K}_{1,2M} \\ \bar{K}_{21} & \bar{K}_{22} & \ldots & \bar{K}_{2,2M} \\ \vdots & \vdots & \vdots & \vdots \\ \bar{K}_{2M,1} & \bar{K}_{2M,2} & \ldots & \bar{K}_{2M,2M} \end{bmatrix},$$

wherein $\bar{K}_{ij} = \exp(-\|x_i - x_j\|^2/2)$, $i,j=1, 2, \ldots, 2M$, M represents the number of the voltage signal sample vectors collected;

D=diag(1/sqrt(diag($\bar{K}$))), wherein diag(•) represents to compute a diagonal matrix, and sqrt(•) represents to compute a root-mean-square of matrix elements; $\bar{K}$ is updated: $\bar{K} \leftarrow D*\bar{K}*D$; and $\bar{K}$ represents to the standardized kernel matrix;

(4.3.2) training a binary classifier, which a training pseudo-code is as follows:
inputting the training sample set $S = \{\{S_+\}, \{S_-\}\}$;
treating process: if a class identifier $y_i = +1$, then $$\alpha_i^+ = \frac{1}{M};$$

otherwise, $\alpha_i^+ = 0$;
if a class identifier $y_i = -1$, then $$\alpha_i^- = \frac{1}{M};$$

otherwise, $\alpha_i^- = 0$; M represents the number of the voltage signal sample vectors collected;
$\alpha^+ = [\alpha_1^+, \alpha_2^+, \ldots, \alpha_{2M}^+]$, $\alpha^- = [\alpha_1^-, \alpha_2^-, \ldots, \alpha_{2M}^-]$; and (4.3.3) computing classifier parameters:
wherein the real number $\alpha_i = \alpha_i^+ - \alpha_i^-$; and
the bias $b = 0.5((\alpha^+)^T \bar{K} \alpha^+ - (\alpha^-)^T \bar{K} \alpha^-)$, wherein $(\bullet)^T$ represents transpose of matrix or vector; and $\bar{K}$ represents to the standardize kernel matrix.

* * * * *